(12) United States Patent
Naiki

(10) Patent No.: US 10,742,186 B2
(45) Date of Patent: Aug. 11, 2020

(54) RECEIVER AND NON-TRANSITORY COMPUTER READABLE MEDIUM STORING PROGRAM

(71) Applicant: JVC KENWOOD Corporation, Yokohama-shi, Kanagawa (JP)

(72) Inventor: Yasunori Naiki, Yokohama (JP)

(73) Assignee: JVCKENWOOD Corporation, Yokohama-shi (JP)

( * ) Notice: Subject to any disclaimer, the term of this patent is extended or adjusted under 35 U.S.C. 154(b) by 0 days.

(21) Appl. No.: 16/296,156

(22) Filed: Mar. 7, 2019

(65) Prior Publication Data

US 2019/0296705 A1  Sep. 26, 2019

(30) Foreign Application Priority Data

Mar. 23, 2018  (JP) .................................. 2018-056687

(51) Int. Cl.
*H03G 3/30* (2006.01)
*H04B 1/10* (2006.01)

(52) U.S. Cl.
CPC ......... *H03G 3/3073* (2013.01); *H04B 1/1027* (2013.01); *H03G 2201/305* (2013.01)

(58) Field of Classification Search
CPC ............... H03G 3/3052; H03G 3/3073; H03G 2201/305; H04B 1/1027
See application file for complete search history.

(56) References Cited

U.S. PATENT DOCUMENTS

| 2009/0010453 | A1* | 1/2009 | Zurek | G10L 21/0208 381/94.5 |
| 2009/0068973 | A1* | 3/2009 | Saito | H04B 1/1027 455/296 |
| 2012/0001687 | A1* | 1/2012 | Urushihara | H03G 3/3078 330/75 |
| 2016/0191007 | A1* | 6/2016 | Li | H03G 9/005 381/107 |
| 2019/0296782 | A1* | 9/2019 | Naiki | H04B 1/1027 |

FOREIGN PATENT DOCUMENTS

JP  2012-156687 A  8/2012

* cited by examiner

*Primary Examiner* — David B Lugo
(74) *Attorney, Agent, or Firm* — Procopio, Cory, Hargreaves & Savitch LLP

(57) ABSTRACT

A receiver and a program capable of, when they have received a pulse noise together with a reception signal, improving quality of the reception signal are provided. A receiver according to present disclosure includes a received-signal amplification circuit configured to amplify a received signal, a gain control circuit configured to set a gain setting value for an AGC operation in the received-signal amplification circuit, the AGC operation being an operation for making an amplitude of an amplified received signal fall within a predetermined range, and a pulse detection circuit configured to monitor a change in the gain setting value and detect whether or not a pulse noise is contained in the received signal based on whether or not the change in the gain setting value meets a predetermined condition.

4 Claims, 10 Drawing Sheets

RECEIVER AND NON-TRANSITORY COMPUTER READABLE MEDIUM STORING PROGRAM

CROSS REFERENCE TO RELATED APPLICATION

This application is based upon and claims the benefit of priority from Japanese patent application No. 2018-056687, filed on Mar. 23, 2018, the disclosure of which is incorporated herein in its entirety by reference.

BACKGROUND

The present disclosure relates to a receiver and a program. In particular, the present disclosure relates to a receiver and a program capable of, when they have received a pulse noise together with a reception signal, preventing (or minimizing) a deterioration of intelligibility of the reception signal.

A receiver that converts a received signal into a signal in an IF (Intermediate Frequency) band and amplifies the obtained IF signal in the IF band has been known. The receiver amplifies the IF signal in an amplification circuit and the amplification circuit has an IF-AGC (Automatic Gain Control) function of automatically controlling its gain.

Japanese Unexamined Patent Application Publication No. 2012-156687 discloses that a power transition of a received signal over time is obtained by calculating power, and a moving average for each moving average section is obtained for the obtained received power value series by calculating moving average power. Further, Japanese Unexamined Patent Application Publication No. 2012-156687 discloses that a section in which a noise is larger than a noise threshold in the obtained moving average power value series is detected as an impulse noise superimposition section by impulse nose detection. Further, Japanese Unexamined Patent Application Publication No. 2012-156687 discloses that a series of processes in which a power value in the impulse noise superimposition section in the received power value series is replaced by a certain substitution power value by power substitution and used as a new received power value series is carried out. Japanese Unexamined Patent Application Publication No. 2012-156687 does not disclose any method for, when a receiver having an IF-AGC function receives a pulse noise together with a reception signal, preventing intelligibility of the reception signal from deteriorating.

SUMMARY

A receiver having an IF-AGC function may receive a pulse noise, which could be caused by, for example, a switching operation of an electric lamp, together with a reception signal. In such cases, the receiver having the IF-AGC function controls its gain according to the pulse noise having an amplitude larger than that of the reception signal. As a result, the amplitude of the reception signal, which is smaller than that of the pulse noise, decreases. Consequently, the intelligibility of the reception signal deteriorates or voices (or sounds) become inaudible. As described above, there is a problem that when the receiver having the IF-AGC function receives a pulse noise together with a reception signal, quality of the reception signal deteriorates.

An object of the present disclosure is to provide a receiver and a program capable of, when they have received a pulse noise together with a reception signal, improving quality of the reception signal.

Accordingly, an embodiment provides a receiver including:
a received-signal amplification circuit configured to amplify a received signal;
a gain control circuit configured to set a gain setting value for an AGC operation in the received-signal amplification circuit, the AGC operation being an operation for making an amplitude of an amplified received signal fall within a predetermined range; and
a pulse detection circuit configured to monitor a change in the gain setting value and detect whether or not a pulse noise is contained in the received signal based on whether or not the change in the gain setting value meets a predetermined condition, in which
when it is detected that the pulse noise is contained in the received signal, the gain control circuit sets the gain setting value immediately before the occurrence of the pulse noise as the gain setting value immediately after the occurrence of the pulse noise in the received-signal amplification circuit.

Further, another embodiment provides a non-transitory computer readable medium storing a program for causing a computer to:
set a gain setting value in a received-signal amplification circuit so that an amplitude of an amplified received signal amplified by the received-signal amplification circuit falls within a predetermined range;
detect that a pulse noise is contained in the received signal when a period that is required for a change in the gain setting value is shorter than a predetermined period threshold and a quantity of the change is larger than a predetermined variation threshold; and
set, when it is detected that the pulse noise is contained in the received signal, the gain setting value immediately before the occurrence of the pulse noise as the gain setting value immediately after the occurrence of the pulse noise in the received-signal amplification circuit.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

Embodiment

Embodiments according to the present disclosure will be described hereinafter with reference to the drawings.

Firstly, an outline of a receiver according to an embodiment is described.

Figure 1:
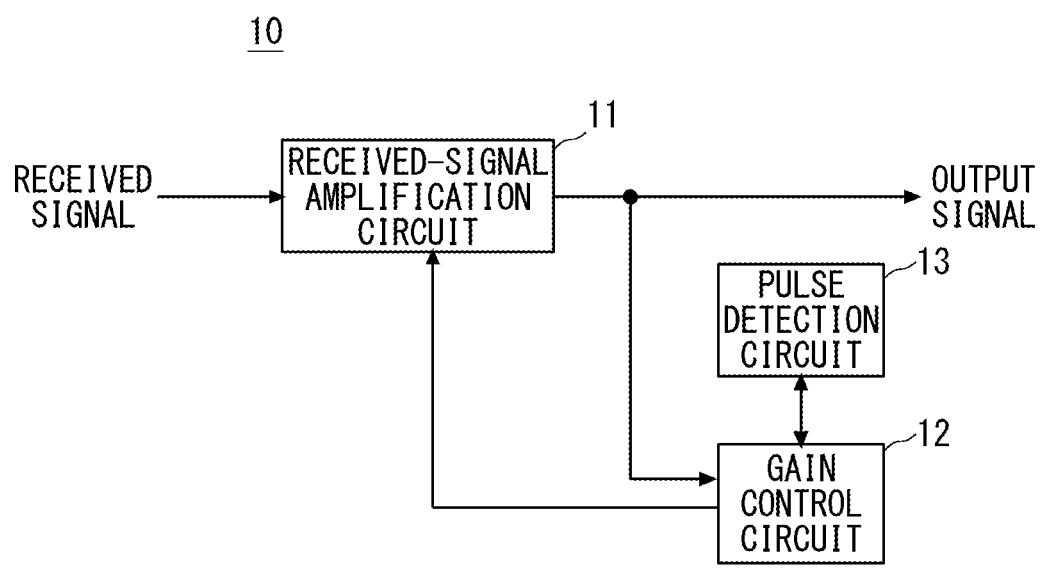
FIG. 1 is a block diagram showing an example of a receiver according to an embodiment.

FIG. 1 is a block diagram showing an example of a receiver according to an embodiment.

As shown in FIG. 1, a receiver 10 according to an embodiment includes a received-signal amplification circuit 11, a gain control circuit 12, and a pulse detection circuit 13.

The received-signal amplification circuit 11 amplifies a received signal.

The gain control circuit 12 sets a gain setting value in the received-signal amplification circuit 11 so that the amplitude of the amplified received signal falls within a predetermined range. The received-signal amplification circuit 11 amplifies the received signal based on the gain setting value.

The pulse detection circuit 13 detects that a pulse noise is contained in the received signal when a period during which a change in the gain setting value is larger than a predetermined variation threshold is shorter than a predetermined period threshold.

When it is detected that a pulse noise is contained in the received signal, the gain control circuit 12 sets a gain setting value that had been used immediately before the occurrence of the pulse noise (hereinafter, simply referred to as a gain setting value immediately before the occurrence of the pulse noise) as a gain setting value that is to be used immediately after the occurrence of the pulse noise (hereinafter, simply referred to as a gain setting value immediately after the occurrence of the pulse noise) in the received-signal amplification circuit 11.

The above-described function of setting a gain setting value in the received-signal amplification circuit 11 so that the amplitude of the received signal amplified by the received-signal amplification circuit 11 falls within the predetermined range is referred to as an AGC function. The AGC function for an IF (Intermediate Frequency) signal in an IF band is referred to as an IF-AGC function. The receiver 10 has this IF-AGC function.

The IF-AGC function is described hereinafter.

The IF-AGC function is a function to control an AGC voltage that is set in the received-signal amplification circuit in order to make an amplitude of a signal amplified by the received-signal amplification circuit fall within a predetermined range. When the AGC voltage is increased, a gain of the received-signal amplification circuit increases and hence an amplitude of an output signal output from the received-signal amplification circuit increases. When the AGC voltage is decreased, the gain of the received-signal amplification circuit decreases and hence the amplitude of the output signal output from the received-signal amplification circuit decreases.

The IF-AGC function rectifies and smooths a part of the output signal, and thereby converts it into a signal value corresponding to the amplitude of the output signal (e.g., converts it into a DC (Direct Current) potential). When the obtained signal value is compared with a predetermined reference value (a predetermined reference level) and the signal value is larger than the predetermined reference value, the gain of the received-signal amplification circuit is decreased and controlled so that the amplitude of the output signal falls within the predetermined range.

An IF-AGC function that is performed when the receiver 10 receives a pulse noise is described hereinafter.

A pulse noise is a noise signal that has a large amplitude in a short period, i.e., a period up to several milliseconds. When a receiver having an IF-AGC function receives such a pulse noise, it performs an operation for decreasing an AGC voltage and thereby decreasing a gain of a received-signal amplification circuit in order to make the amplitude of the pulse noise equal to or higher than the reference level fall within the predetermined range. The above-described operation is referred to as an attack operation. In the attack operation, in order to make the amplitude of the pulse noise fall within the predetermined range, the gain of the received-signal amplification circuit is decreased by, for example, decreasing the AGC voltage over a period of about two milliseconds.

Then, after the pulse noise has passed (i.e., has disappeared), there is no pulse noise. As a result, the amplitude of the signal input to the received-signal amplification circuit decreases. Therefore, in order to recover (i.e., raise) the gain of the received-signal amplification circuit, which has been decreased until then, the receiver performs an operation for increasing the AGC voltage and thereby increasing the gain of the received-signal amplification circuit. The above-described operation is referred to as a release operation. In the release operation, the gain of the received-signal amplification circuit is recovered by, for example, increasing the AGC voltage over a period of about 100 milliseconds to 10 seconds.

Further, in the case where the receiver receives a pulse noise together with a reception signal (i.e., where a pulse noise is contained in a reception signal), every time the pulse noise is input to the receiver, the gain of the received-signal amplification circuit is decreased by the attack operation. As a result, the amplitude of the target reception signal decreases. Therefore, its intelligibility deteriorates or voices (or sounds) become inaudible.

Therefore, the receiver 10 according to the embodiment sets, when it is detected that a pulse noise is contained in a reception signal, a gain setting value immediately before the occurrence of the pulse noise as a gain setting value immediately after the occurrence of the pulse noise in the received-signal amplification circuit 11. In this way, it is possible to alleviate the decrease in the gain of the received-signal amplification circuit 11, which would otherwise be caused by the attack operation.

Next, details of the receiver according to the embodiment are described.

Figure 2:
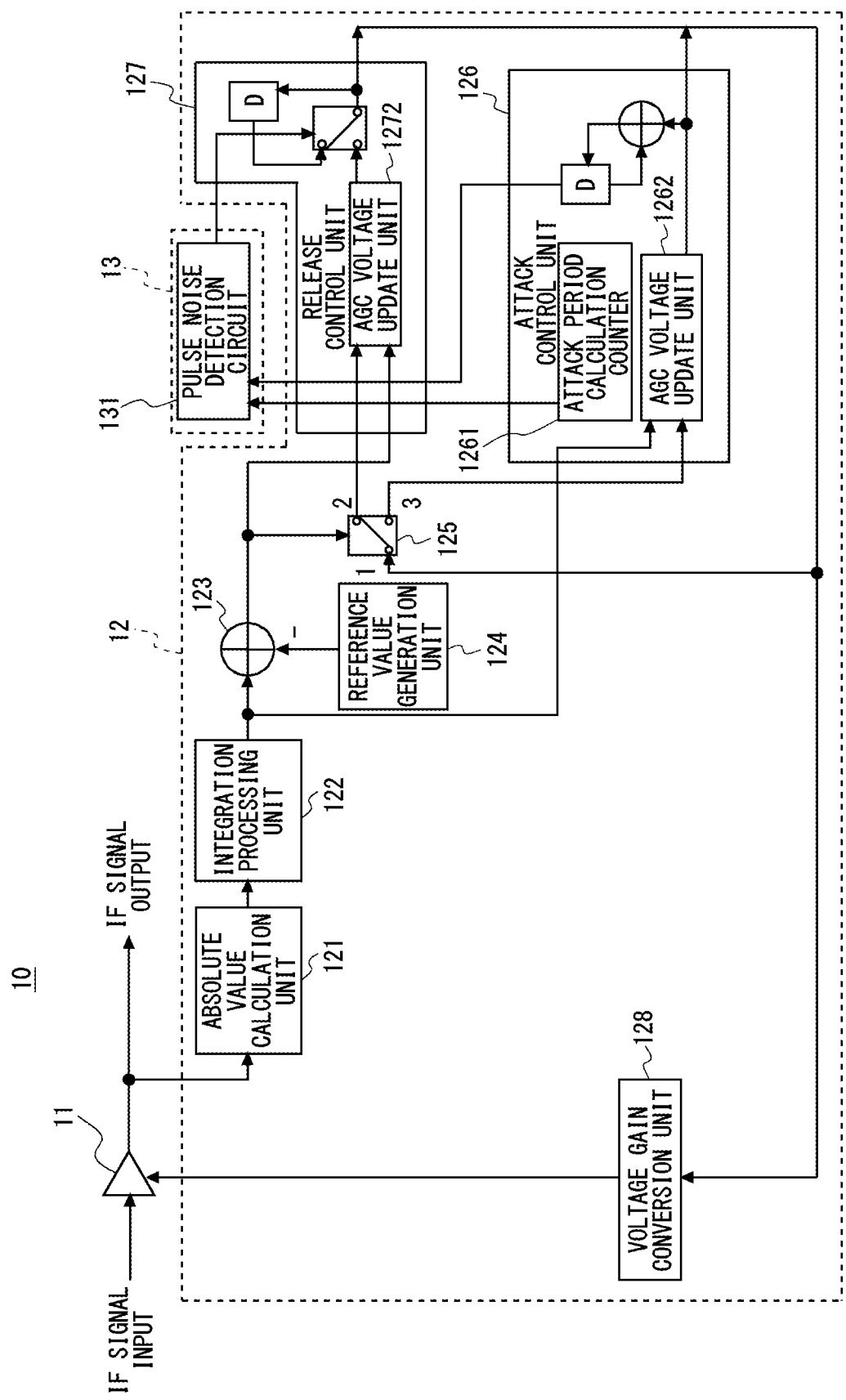
FIG. 2 is a block diagram showing an example of a receiver according to an embodiment.

FIG. 2 is a block diagram showing an example of a receiver according to an embodiment.

In FIG. 2, details of the receiver are described by using an example in which: a received signal is converted into an IF (Intermediate Frequency) signal in an IF band; the obtained IF signal is amplified by the received-signal amplification circuit 11; and an IF-AGC function is performed for the amplified IF signal. Embodiments are not limited to this example. The received signal may be amplified and an AGC function may be performed for the amplified received signal.

As shown in FIG. 2, the gain control circuit 12 of the receiver 10 includes an absolute value calculation unit 121, an integration processing unit 122, a difference calculation unit 123, a reference value generation unit 124, a release control unit 127, an attack control unit 126, a switching unit 125, and a voltage gain conversion unit 128. The pulse detection circuit 13 includes a pulse noise detection circuit 131.

The receiver 10 receives a reception signal and the reception signal is converted into an IF signal in an IF band. The received-signal amplification circuit 11 amplifies the obtained IF signal. The absolute value calculation unit 121 converts an amplitude of the IF signal into an absolute value by using, for example, a rectification circuit. The integration processing unit 122 integrates (smooths) the absolute value of the amplitude of the IF signal and outputs a signal value corresponding to the amplitude of the IF signal to the difference calculation unit 123 and the attack control unit 126. The difference calculation unit 123 calculates a difference between the signal value and a reference value generated by the reference value generation unit 124. The reference value may also be referred to as a reference level.

When the difference is larger than zero, i.e., when the signal value is larger than the reference value, the switching unit 125 connects a terminal 1 to a terminal 3 in order to select an attack operation performed by the attack control unit 126. As a result, an output voltage of the attack control unit 126 is selected as an AGC voltage.

Further, when the difference is equal to or smaller than zero, i.e., when the signal value is equal to or smaller than the reference value, the switching unit 125 connects the terminal 1 to a terminal 2 in order to select a release operation performed by the release control unit 127. As a result, an output voltage of the release control unit 127 is selected as the AGC voltage. The AGC voltage corresponds to the gain setting value that is set in the received-signal amplification circuit 11.

The pulse detection circuit 13 includes a pulse noise detection circuit 131. The pulse noise detection circuit 131 monitors changes in the AGC voltage of the IF-AGC and detects whether or not a change that meets a predetermined condition has occurred. When it is detected that the predetermined change has occurred in the AGC voltage, the pulse noise detection circuit 131 detects that a pulse noise is contained in the IF signal. Further, when it is not detected that the predetermined change has occurred in the AGC voltage, the pulse noise detection circuit 131 detects that no pulse noise is contained in the IF signal.

Specifically, the pulse noise detection circuit 131 detects that a pulse noise is contained in the IF signal when the below-shown Expressions (1) and (2) are satisfied.

[Expression 1]

$$Tk < Tkt \quad (1)$$

where Tk is an attack period and Tkt is an attack period threshold.

When the signal value is larger than the reference value, the gain control circuit 12 performs an attack operation for decreasing the AGC voltage and thereby decreasing the gain of the received-signal amplification circuit 11 in order to make the amplitude of the IF signal fall within the predetermined range. The state where the signal value is larger than the reference value is also referred to as (i.e., also means) a state where the difference between the signal value and the reference value is larger than zero. The attack period Tk is a period during which the difference between the signal value and the reference value is larger than zero. Further, the attack period Tk may be a period during which the attack control section 126 performs the attack operation. The attack control unit 126 includes an attack period calculation counter 1261. The attack period calculation counter 1261 measures the attack period Tk by performing a counting process for each sample during the attack period Tk.

The attack period threshold Tkt has a predetermined value. The attack period threshold may also be referred to as a predetermined period threshold.

[Expression 2]

$$(Vg/Tk) > Vgt \quad (2)$$

where Vg is a voltage change total quantity and Vgt is an average voltage variation threshold.

The voltage change total quantity Vg is the total quantity of changes in the AGC voltage during the attack period Tk. The average voltage variation threshold Vgt is a threshold for an average variation the AGC voltage. The term (Voltage change total quantity Vg/Attack period Tk) is an average variation of the AGC voltage per unit time when an attack operation is performed for a pulse noise. The average variation of the AGC voltage per unit time may also be referred to as a variation of the AGC voltage (or a quantity of change in the AGC voltage). The average voltage variation threshold may also be referred to as a predetermined variation threshold.

When the attack period Tk is shorter than the attack period threshold Tkt and the total quantity of changes in the AGC voltage during the attack period Tk is larger than the average voltage variation threshold Vgt, the pulse noise detection circuit 131 detects that a pulse noise is contained in the received signal. Then, the gain control circuit 12 feeds back an AGC voltage immediately before the occurrence of the pulse noise, which has been held in the gain control circuit 12, to the received-signal amplification circuit 11 and thereby sets the AGC voltage in the received-signal amplification circuit 11.

As described above, the pulse detection circuit 13 of the receiver 10 detects, based on a characteristic operation of the IF-AGC function due to a pulse noise, whether or not a pulse noise is contained in a received signal from the attack period Tk during which an attack operation is performed and the value of the AGC voltage that has been controlled in the attack operation.

The receiver 10 may include a plurality of band limiting filters (not shown) to limit a band of an IF signal. A band limiting filter may be exclusively selected from the plurality of band limiting filters and is selected according to the radio wave format and/or the bandwidth in which the receiver 10 performs receiving. A pulse width (i.e., a time width) of a pulse noise becomes longer as the pulse noise passes through a band limiting filter, compared to when the pulse width does not pass through the band limiting filter. Further, when a pulse noise passes through a band limiting filter having a bandwidth narrower than a predetermined bandwidth, its time width becomes longer, compared to when the pulse noise passes through a band limiting filter having the predetermined bandwidth. That is, the narrower the bandwidth of the band limiting filter is, the longer the time width of the pulse noise that has passed through the band limiting filter becomes.

Therefore, the receiver 10 may change the attack time threshold Tkt according to the type of the used band limiting filter. Further, the receiver 10 may change the attack period threshold Tkt according to the bandwidth of the used band limit filter.

An amplitude of a pulse noise becomes smaller as the pulse noise passes through a band limiting filter, compared to when the pulse width does not pass through the band limiting filter. Further, when a pulse noise passes through a band limiting filter having a bandwidth narrower than a predetermined bandwidth, its amplitude becomes smaller, compared to when the pulse noise passes through a band limiting filter having the predetermined bandwidth. That is, the narrower the bandwidth of the band limiting filter is, the smaller the amplitude of the pulse noise that has passed through the band limiting filter becomes.

Therefore, the receiver 10 may change the average voltage variation threshold Vgt according to the type of the used band limiting filter. Further, the receiver 10 may change the average voltage variation threshold Vgt according to the bandwidth of the used band limitation filter.

The technical matters described above are summarized as follows. In the case where a receiver having an IF-AGC function receives a pulse noise together with a reception signal, every time the pulse noise is input to the receiver, the gain of the received-signal amplification circuit is decreased by an attack operation. Consequently, the target reception signal is affected by this and its intelligibility deteriorates. Alternatively, voices (or sounds) become inaudible. Further, in this state, for example, it takes at least about 100 milliseconds to recover the gain to 60 dB through a release operation. As a result, a silent period occurs, thus making a comfortable reception difficult.

Therefore, the gain control circuit 12 of the receiver 10 according to the embodiment sets, when it is detected that a pulse noise is contained in a reception signal based on a detection result of the pulse detection circuit 13, an AGC voltage immediately before the start of an attack operation for the pulse noise as an AGC voltage that should be set immediately after the detection of the pulse noise in the received-signal amplification circuit 11. In this way, it is possible to alleviate (i.e., reduce) the suppression of the gain of the received-signal amplification circuit 11, which would otherwise be caused in the period of the release operation performed after the attack operation, and thereby to reduce (or shorten) the silent period.

Figure 6:
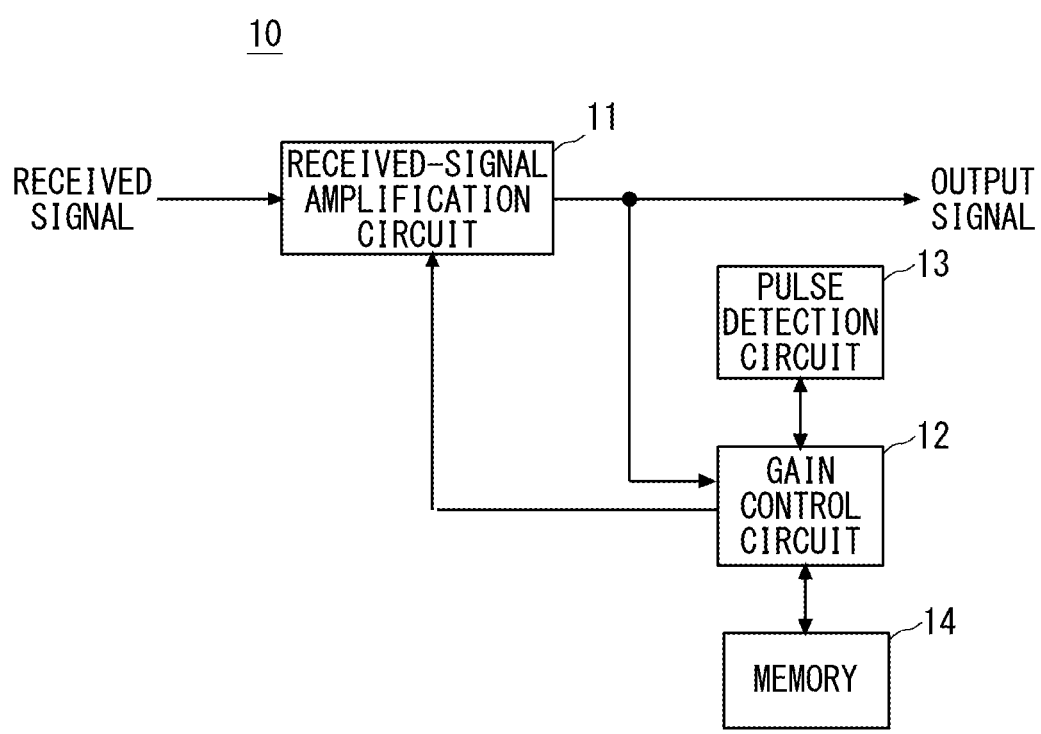
FIG. 6 is a block diagram showing an example of a receiver according to an embodiment.

Further, as shown in FIG. 6, the receiver 10 may further include a memory 14 that stores an AGC voltage(s) (gain setting value(s)). The gain control circuit 12 may read an AGC voltage immediately before the start of an attack operation (i.e., a past gain setting value) from the memory 14 and set the past gain setting value in the received-signal amplification circuit 11. Further, the AGC voltage is updated when the AGC operation is changed from a release operation to an attack operation, or changed from an attack operation to a release operation. That is, it is possible to store a gain setting value(s) at a point(s) when the AGC operation is changed. The gain control circuit 12 can hold an AGC voltage immediately before a pulse noise is input.

The gain control circuit 12 may further include a voltage gain conversion unit 128 that converts the AGC voltage output from the attack control unit 126 or the release control unit 127 into a gain control signal for controlling the gain of the received-signal amplification circuit 11. The voltage gain conversion unit 128 outputs the obtained gain control signal to the received-signal amplification circuit 11. The received-signal amplification circuit 11 controls the gain by using the gain control signal.

Next, an operation performed by the receiver according to the embodiment is described.

Figure 3:
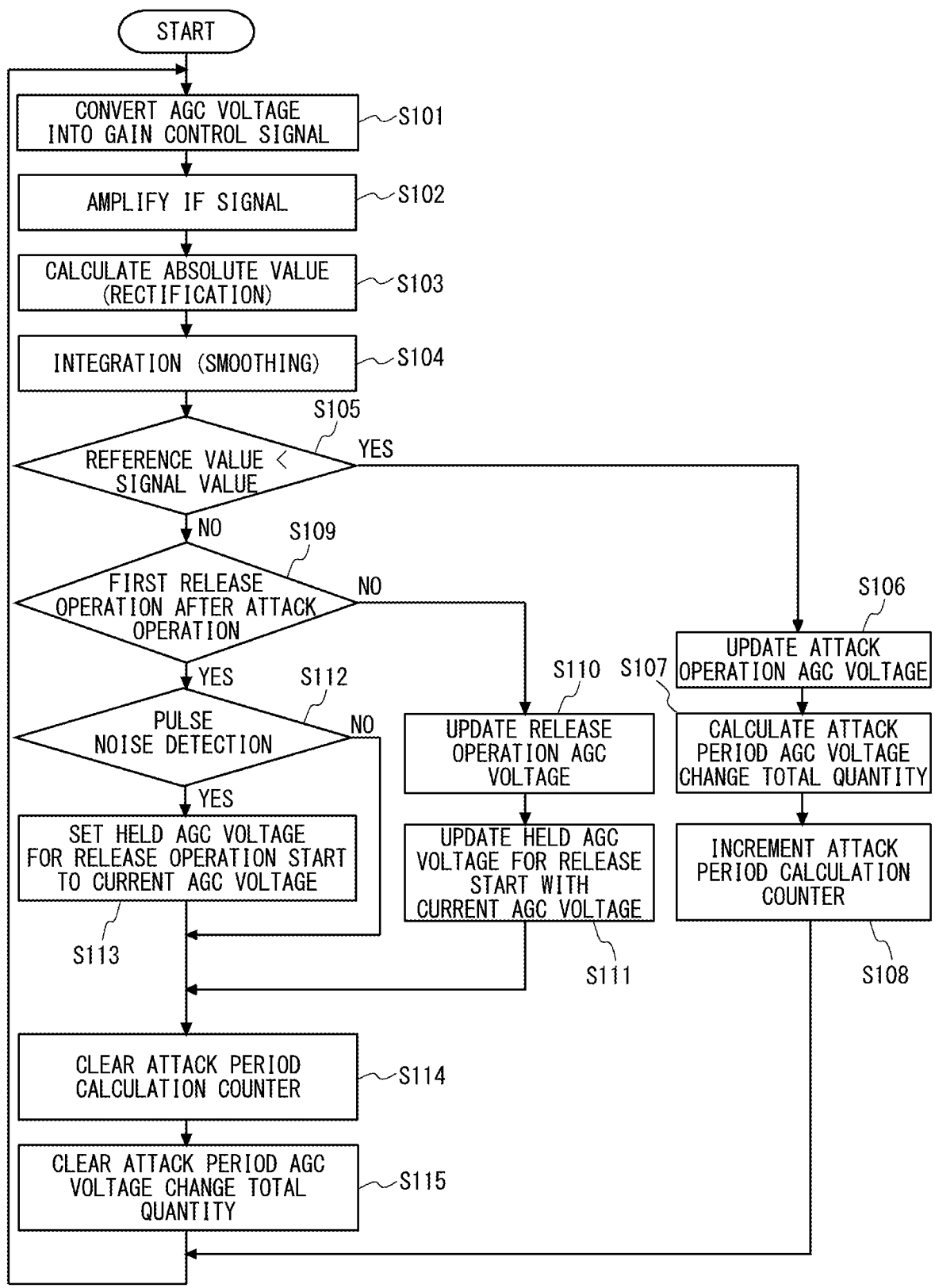
FIG. 3 is a flowchart showing an example of an operation performed by a receiver according to an embodiment.

FIG. 3 is a flowchart showing an example of an operation performed by the receiver according to the embodiment.

As shown in FIG. 3, the voltage gain conversion unit 128 converts an AGC voltage into a gain control signal in order to set the gain of the received-signal amplification circuit 11 (step S101). The voltage gain conversion unit 128 outputs the obtained gain control signal to the received-signal amplification circuit 11.

The received-signal amplification circuit 11 amplifies an IF signal based on the gain control signal (step S102).

The absolute value calculation unit 121 calculates (i.e., rectifies) an absolute value of an amplitude of the IF signal (step S103).

The integration processing unit 122 integrates (i.e., smooths) the absolute value of the amplitude of the IF signal, and outputs a signal value thereof (step S104).

The difference calculation unit 123 detects whether or not the signal value is larger than a reference value (step S105).

When the signal value is larger than the reference value (step S105: Yes), the switching unit 125 connects a terminal 1 to a terminal 3 in order to select an attack operation performed by the attack control unit 126. The attack control unit 126 performs the attack operation (step S106). An AGC voltage update unit 1262 updates the AGC voltage according to the attack operation (step S106).

The attack control unit 126 cumulatively added the AGC voltage value during the attack period Tk and thereby calculates the attack period AGC voltage change total quantity (step S107).

The attack control unit 126 increments the attack period calculation counter 1261 to calculate the attack time Tk (step S108).

When the signal value is equal to or smaller than the reference value (step S105: No), the switching unit 125 connects the terminal 1 to a terminal 2 in order to select a release operation performed by the release control unit 127. The release control unit 127 checks whether or not the current release operation is the first release operation after the attack operation (step S109).

When the current release operation is not the first release operation after the attack operation (step S109: No), an AGC voltage update unit 1272 of the release control unit 127 updates the AGC voltage of the release operation (step S110).

The release control unit 127 updates the held AGC voltage, i.e., the AGC voltage that has been held for the start of the release operation, with the current AGC voltage (step S111).

When the current release operation is the first release operation after the attack operation (step S109: Yes), the AGC voltage update unit 1272 of the release control unit 127 instructs the pulse noise detection circuit 131 to detect whether or not a pulse noise is contained in the IF signal (step S112).

When the pulse noise detection circuit 131 detects that a pulse noise is contained in the IF signal (step S112: Yes), it sets the held AGC voltage for the start of the release operation to the current AGC voltage (step S113).

When the step S112 is "No" after the step S111, or after the step S113, the attack control unit 126 clears (i.e., initializes) the attack period calculation counter 1261 (step S114).

The attack control unit 126 clears the attack period AGC voltage change total quantity (step S115).

After the step S115, the receiver 10 returns to the step S101.

Next, effects of the receiver according to the embodiment are described.

Figure 4A:
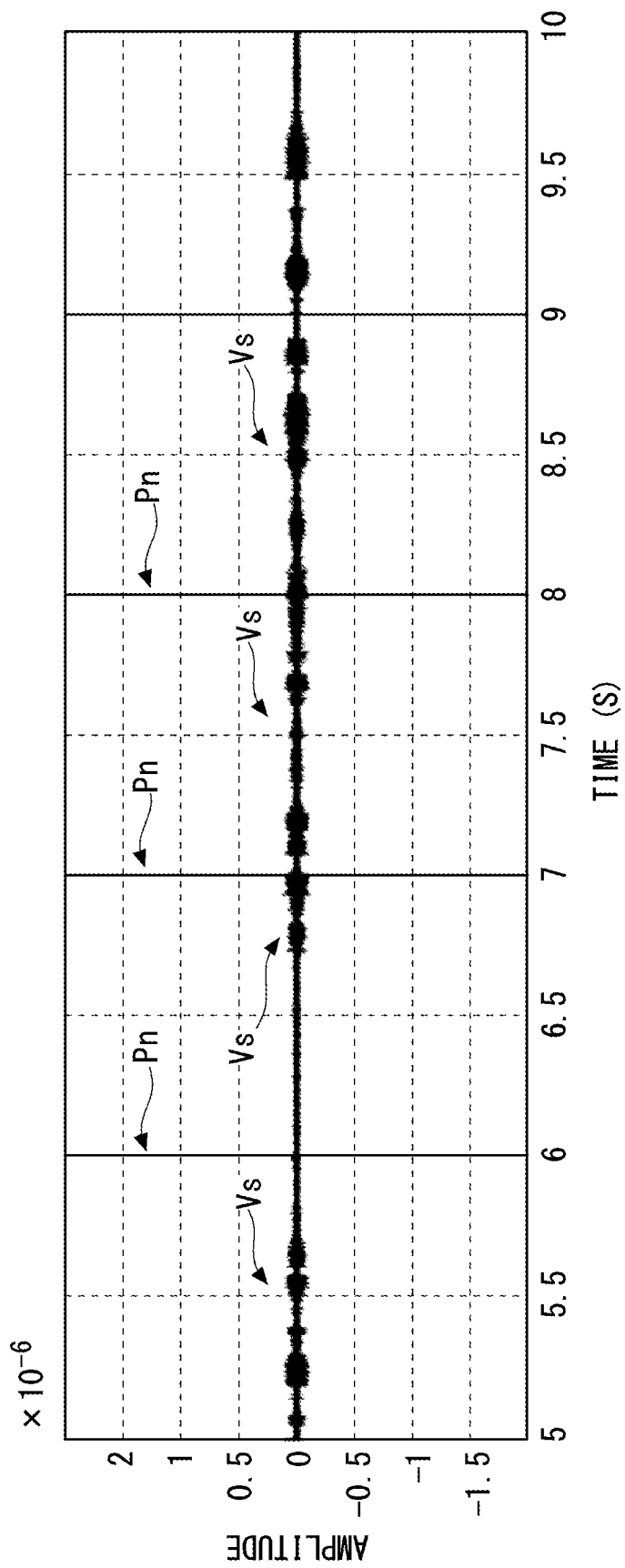
FIG. 4A is a graph showing an example of an IF signal input to a received-signal amplification circuit.

FIG. 4A is a graph showing an example of an IF signal input to the received-signal amplification circuit.

In FIG. 4A, a horizontal axis represents time and a vertical axis represents amplitudes. In FIG. 4A, Vs indicates a voice signal (or a sound signal) and Pn indicates a pulse noise.

Figure 4B:
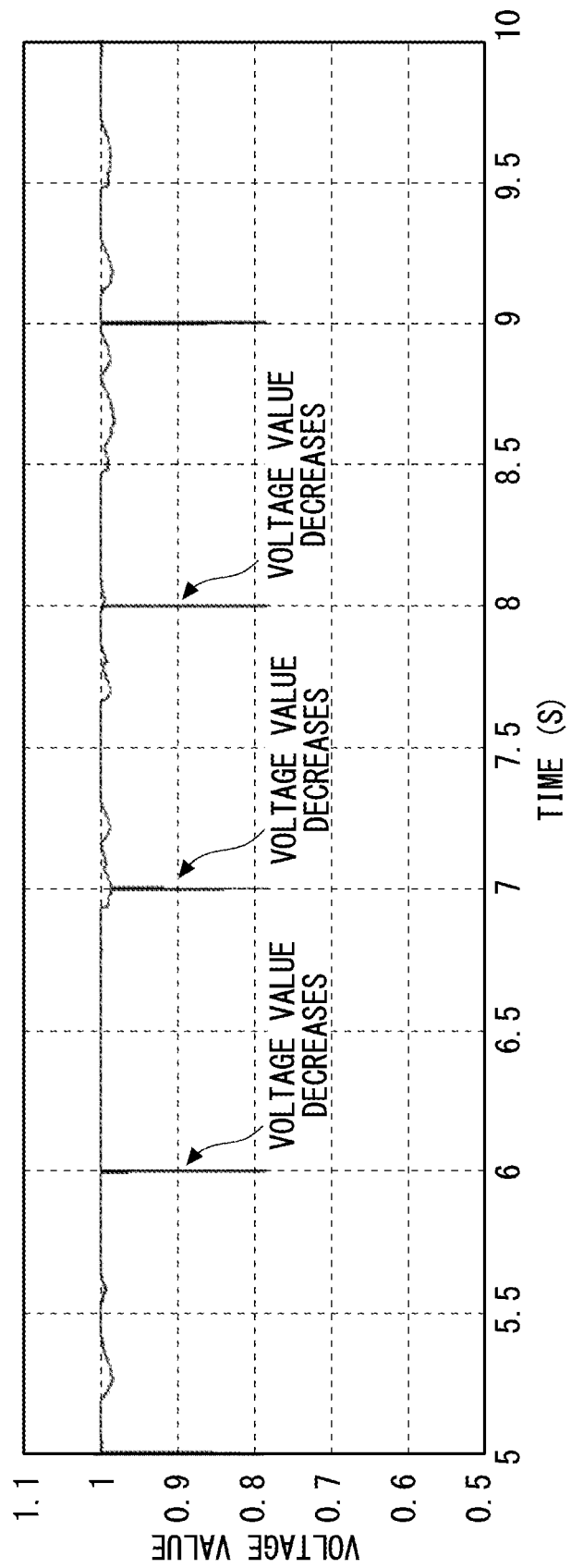
FIG. 4B is a graph showing an example of an AGC voltage set in a received-signal amplification circuit.

FIG. 4B is a graph showing an example of an AGC voltage set in the received-signal amplification circuit.

In FIG. 4B, a horizontal axis represents time and a vertical axis represents voltage values for attenuation quantity setting.

Figure 4C:
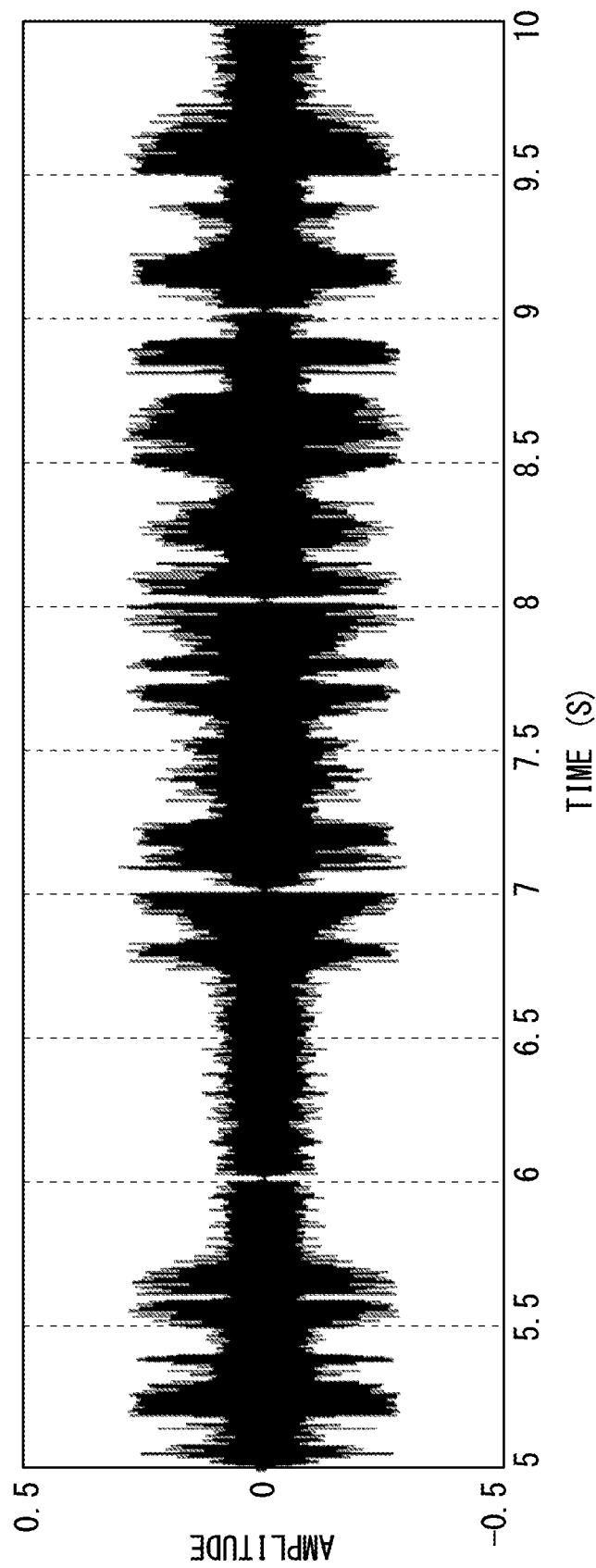
FIG. 4C is a graph showing an example of an IF signal output from a received-signal amplification circuit.

FIG. 4C is a graph showing an example of an IF signal output from the received-signal amplification circuit.

In FIG. 4C, a horizontal axis represents time and a vertical axis represents amplitudes.

FIGS. 4A to 4C show graphs in the case of a signal level in which an IF-AGC function is performed only for pulse noises and it is not performed for voice signals (or sound signals).

As shown in FIG. 4A, the IF signal contains pulse noises indicated by Pn in addition to voice signals indicated by Vs.

As shown in FIG. 4B, when a pulse noise shown in FIG. 4A is input to the received-signal amplification circuit 11, an attack operation is started. The voltage value of the AGC voltage decreases as the attack operation is performed.

As shown in FIG. 4C, when it is detected that a pulse noise is contained in the IF signal, the receiver 10 sets an AGC voltage immediately before the occurrence of the pulse noise as an AGC voltage immediately after the occurrence of the pulse noise in the received-signal amplification circuit 11. As a result, the period during which the IF output signal is decreased due to the pulse noise is shortened.

Figure 5A:
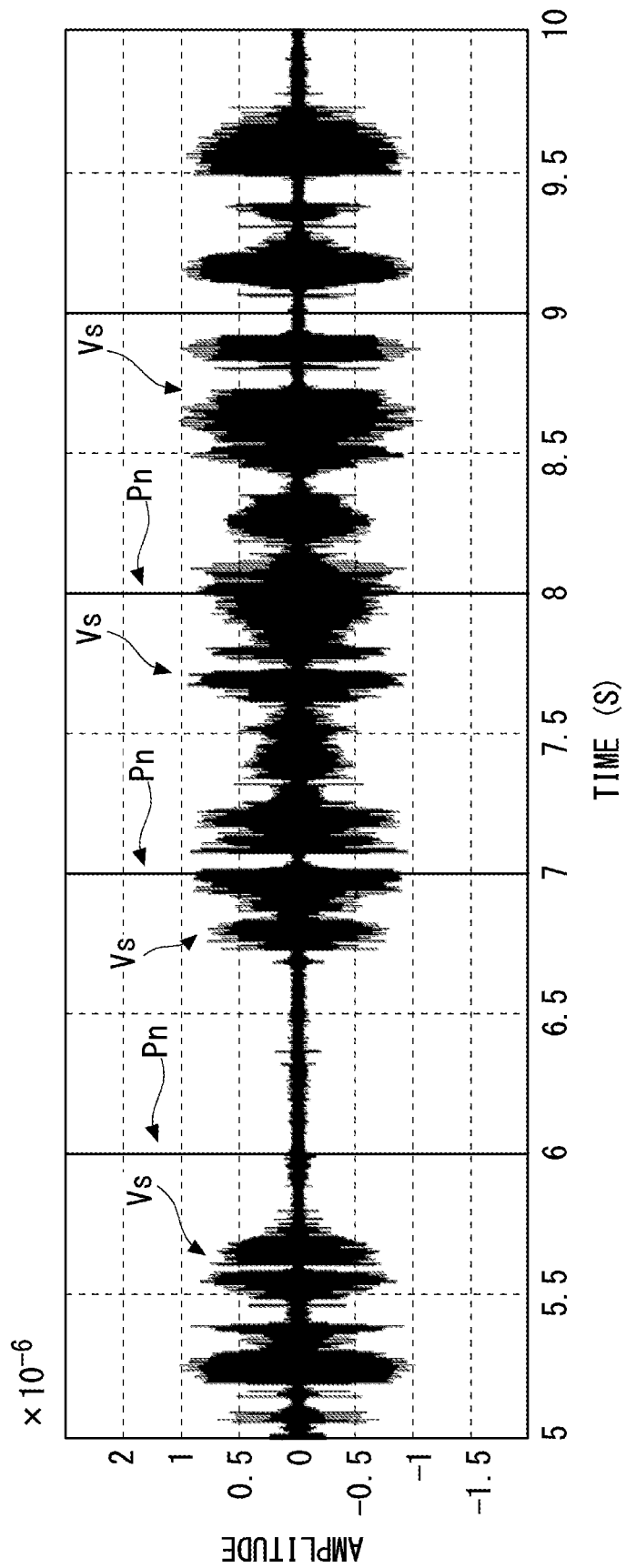
FIG. 5A is a graph showing an example of an IF signal input to a received-signal amplification circuit.

FIG. 5A is a graph showing an example of an IF signal input to the received-signal amplification circuit.

In FIG. 5A, a horizontal axis represents time and a vertical axis represents amplitudes. In FIG. 5A, Vs indicates a voice signal (or a sound signal) and Pn indicates a pulse noise.

Figure 5B:
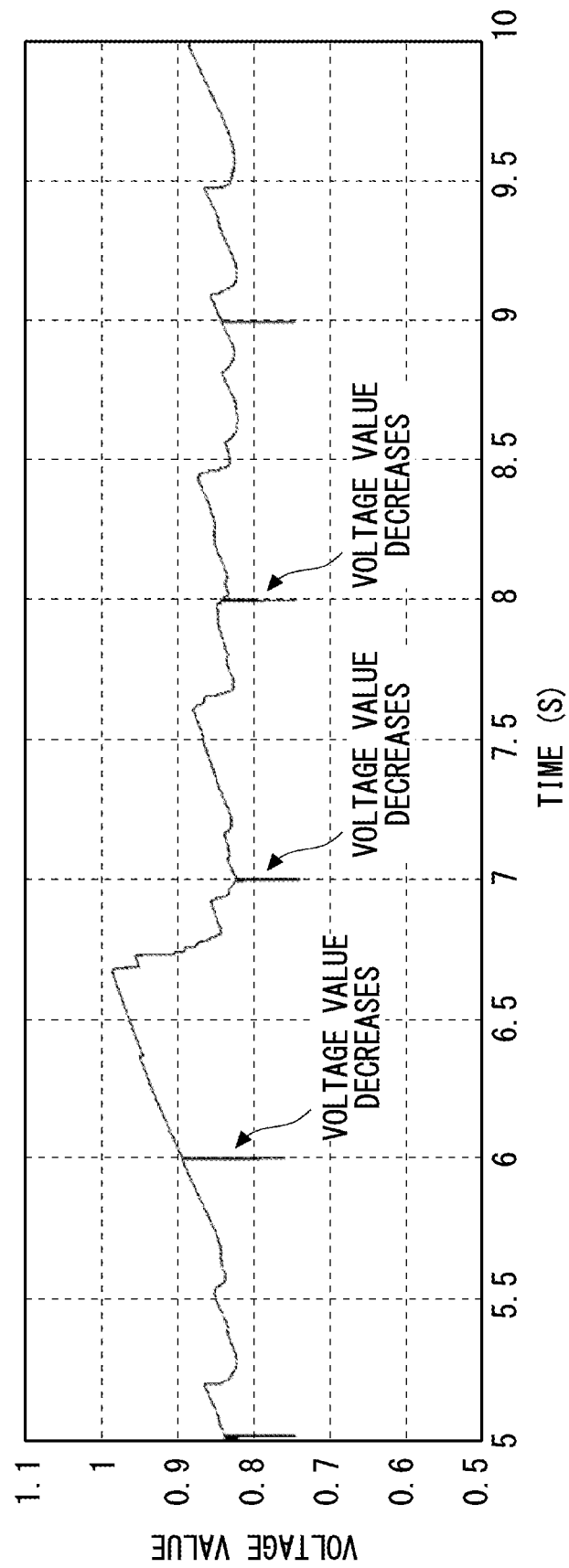
FIG. 5B is a graph showing an example of an AGC voltage set in a received-signal amplification circuit.

FIG. 5B is a graph showing an example of an AGC voltage set in the received-signal amplification circuit.

In FIG. 5B, a horizontal axis represents time and a vertical axis represents voltage values.

Figure 5C:
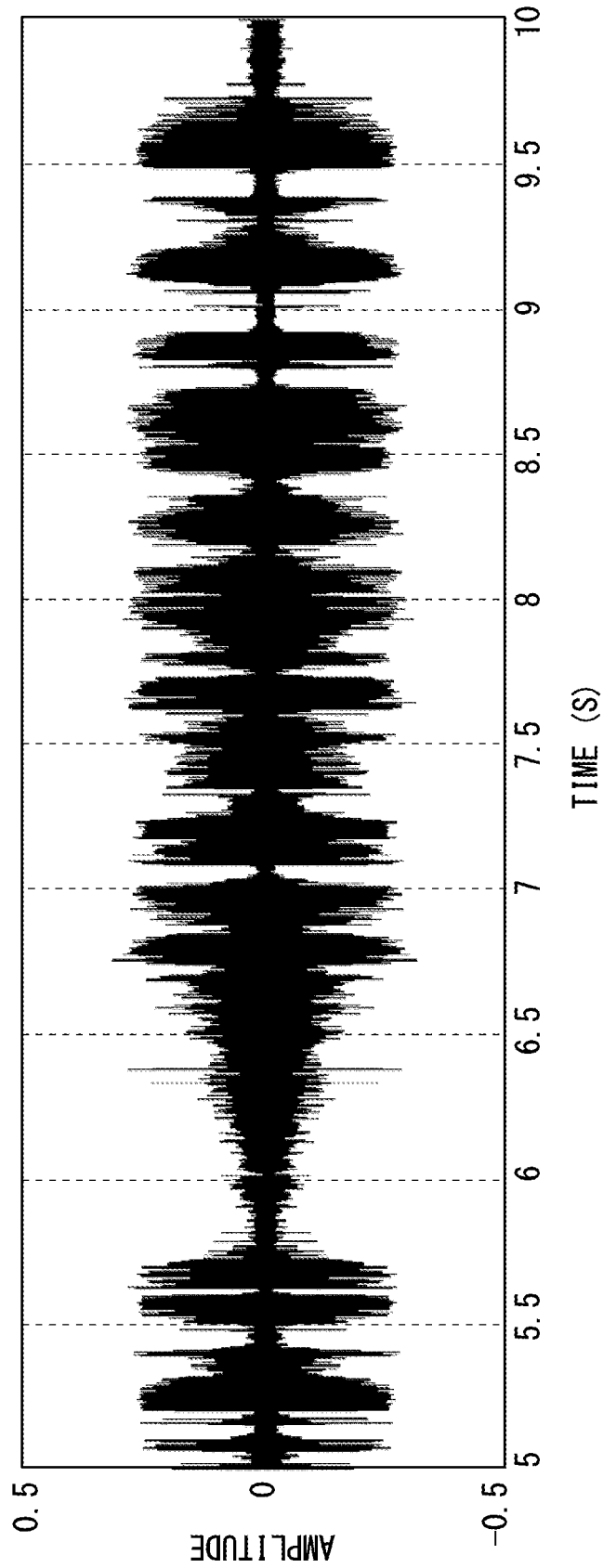
FIG. 5C is a graph showing an example of an IF signal output from a received-signal amplification circuit.

FIG. 5C is a graph showing an example of an IF signal output from the received-signal amplification circuit.

In FIG. 5C, a horizontal axis represents time and a vertical axis represents amplitudes.

FIG. 5A to 5C show graphs in the case where the IF-AGC function is performed at the signal level of the signal.

As shown in FIG. 5A, the IF signal contains pulse noises indicated by Pn in addition to voice signals indicated by Vs.

As shown in FIG. 5B, when a pulse noise shown in FIG. 5A is input to the received-signal amplification circuit 11, an attack operation is started. The voltage value of the AGC voltage decreases as the attack operation is performed. The IF-AGC function is also performed for the voice signal. Therefore, when the voice signal is large, the AGC voltage value is low, whereas when the voice signal is small, the AGC voltage value is high.

As shown in FIG. 5C, when it is detected that a pulse noise is contained in the IF signal, the receiver 10 sets an AGC voltage immediately before the occurrence of the pulse noise as an AGC voltage immediately after the occurrence of the pulse noise in the received-signal amplification circuit 11. As a result, the period during which the IF output signal is decreased due to the pulse noise is shortened.

As described above, in the receiver 10 according to the embodiment, it is possible to solve problematic suppression due to pulse noises while maintaining an advantageous fast response characteristic, and thereby to comfortably receive the target signal.

In the receiver 10 according to the embodiment, the IF-AGC function includes a function of detecting a pulse noise and a function of recovering the gain of the received-signal amplification circuit 11 that has been decreased due to the pulse noise. In this way, it is possible to preventing (or minimizing) a deterioration of intelligibility of a reception signal.

Consequently, in the embodiment, it is possible to provide a receiver and a program capable of, when they have received a pulse noise together with a reception signal, preventing (or minimizing) a deterioration of intelligibility of the reception signal.

Note that the embodiment has been described by using an example case in which the AGC voltage is used to control the gain of the received-signal amplification circuit 11. However, the present disclosure is not limited to this example.

Note that the present disclosure is not limited to the above-described embodiments and may be modified as appropriate without departing from the spirit of the present disclosure.

The program can be stored and provided to a computer using any type of non-transitory computer readable media. Non-transitory computer readable media include any type of tangible storage media. Examples of non-transitory computer readable media include magnetic storage media (such as floppy disks, magnetic tapes, hard disk drives, etc.), optical magnetic storage media (e.g. magneto-optical disks), CD-ROM (compact disc read only memory), CD-R (compact disc recordable), CD-R/W (compact disc rewritable), and semiconductor memories (such as mask ROM, PROM (programmable ROM), EPROM (erasable PROM), flash ROM, RAM (random access memory), etc.). The program may be provided to a computer using any type of transitory computer readable media. Examples of transitory computer readable media include electric signals, optical signals, and electromagnetic waves. Transitory computer readable media can provide the program to a computer via a wired communication line (e.g. electric wires, and optical fibers) or a wireless communication line.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A receiver comprising:
    a received-signal amplification circuit configured to amplify a received signal;
    a gain control circuit configured to rectify the amplified received signal to calculate an absolute value, to smooth the rectified received signal to a signal value, to calculate a difference value between the signal value and a predetermined reference value, and to set a gain setting value for an AGC operation, based on the difference value, in the received-signal amplification circuit, the AGC operation being an operation for making an amplitude of the amplified received signal fall within a predetermined range; and
    a pulse detection circuit configured to detect that a pulse noise is contained in the received signal when a period that is required for a change in the gain setting value in a period during which the signal value is larger than the predetermined reference value is shorter than a predetermined period threshold and a quantity of the change is larger than a predetermined variation threshold, wherein
    when it is detected that the pulse noise is contained in the received signal, the gain control circuit sets the gain setting value immediately before the occurrence of the pulse noise as the gain setting value immediately after the occurrence of the pulse noise in the received-signal amplification circuit.

2. The receiver according to claim 1, further comprising a plurality of filters configured to be exclusively used, wherein
when the gain control circuit sets the gain setting value for the received signal that has already passed through the filter, the pulse detection circuit changes at least one of the predetermined period threshold and the predetermined variation threshold based on a type of the filter.

3. The receiver according to claim 1, further comprising a memory configured to store the gain setting value, wherein
the gain setting value is stored at a point when the AGC operation is changed.

4. A non-transitory computer readable medium storing a program for causing a computer to:
rectify an amplified received signal to calculate an absolute value;
smooth the rectified received signal to a signal value;
calculate a difference value between the signal value and a predetermined reference value;
set a gain setting value, based on the difference value, in a received-signal amplification circuit so that an amplitude of the amplified received signal amplified by the received-signal amplification circuit falls within a predetermined range;
detect that a pulse noise is contained in the received signal when a period that is required for a change in the gain setting value in a period during which the signal value is larger than the predetermined reference value is shorter than a predetermined period threshold and a quantity of the change is larger than a predetermined variation threshold; and
set, when it is detected that the pulse noise is contained in the received signal, the gain setting value immediately before the occurrence of the pulse noise as the gain setting value immediately after the occurrence of the pulse noise in the received-signal amplification circuit.

* * * * *